US010264341B2

(12) United States Patent
Andrikowich et al.

(10) Patent No.: US 10,264,341 B2
(45) Date of Patent: Apr. 16, 2019

(54) MAGNETIC PIVOT SENSOR FOR HEADSET MICROPHONE

(71) Applicant: Bose Corporation, Framingham, MA (US)

(72) Inventors: Thomas George Andrikowich, Whitinsville, MA (US); Stephen J. Maguire, Grafton, MA (US); Matthew Neil Ruwe, Hopedale, MA (US); Paul Yamkovoy, Acton, MA (US); Michael Salame, Newton, MA (US)

(73) Assignee: BOSE CORPORATION, Framingham, MA (US)

( * ) Notice: Subject to any disclaimer, the term of this patent is extended or adjusted under 35 U.S.C. 154(b) by 0 days.

(21) Appl. No.: 15/411,738

(22) Filed: Jan. 20, 2017

(65) Prior Publication Data

US 2018/0213313 A1   Jul. 26, 2018

(51) Int. Cl.
| | | |
|---|---|---|
| *H04R 1/08* | (2006.01) | |
| *H04R 1/10* | (2006.01) | |
| *G01R 33/04* | (2006.01) | |
| *G01R 33/07* | (2006.01) | |
| *G01B 7/30* | (2006.01) | |
| *H04M 1/60* | (2006.01) | |
| *G01D 5/14* | (2006.01) | |

(52) U.S. Cl.
CPC .......... *H04R 1/083* (2013.01); *H04R 1/1041* (2013.01); *H04R 1/1066* (2013.01); *G01B 7/30* (2013.01); *G01D 5/145* (2013.01); *G01R 33/04* (2013.01); *G01R 33/072* (2013.01); *H04M 1/6066* (2013.01); *H04R 1/1016* (2013.01); *H04R 2201/025* (2013.01)

(58) Field of Classification Search
CPC ...... H04R 1/083; H04R 1/1016; H04R 1/105; H04R 3/00; G01D 5/145; G01R 33/072; G01R 33/077; G01R 33/007; H04M 1/00; F16M 11/2014
See application file for complete search history.

(56) References Cited

U.S. PATENT DOCUMENTS

| | | | |
|---|---|---|---|
| 4,156,191 A | | 5/1979 | Knight et al. |
| 4,489,303 A | * | 12/1984 | Martin ............... G05G 9/04785 200/6 A |
| 4,555,120 A | | 11/1985 | Frait et al. |
| 5,446,788 A | | 8/1995 | Lucey et al. |

(Continued)

FOREIGN PATENT DOCUMENTS

| | | | |
|---|---|---|---|
| CN | 1897801 A | * | 1/2007 |
| CN | 102082981 A | * | 6/2011 |

*Primary Examiner* — Davetta W Goins
*Assistant Examiner* — Kuassi A Ganmavo
(74) *Attorney, Agent, or Firm* — Schmeiser, Olsen & Watts LLP

(57) ABSTRACT

A microphone pivot device of a headphone comprises at least one magnet in communication with a movable microphone, the at least one magnet having a plurality of segments, each segment having a magnet characteristic; a sensor that detects a magnet characteristic of a magnet segment when the segment is moved in response to a movement of the microphone so that the segment is in proximity of the sensor; and a controller that receives a signal from the sensor in response to the detected magnet characteristic, and that controls an operation of the microphone in response to the received signal.

19 Claims, 8 Drawing Sheets

(56) References Cited

U.S. PATENT DOCUMENTS

| | | | | |
|---|---|---|---|---|
| 5,619,195 | A * | 4/1997 | Allen | G05G 9/047 |
| | | | | 200/6 R |
| 6,016,347 | A * | 1/2000 | Magnasco | H04R 1/1041 |
| | | | | 379/430 |
| 6,124,709 | A * | 9/2000 | Allwine | G01D 5/145 |
| | | | | 324/207.2 |
| 6,670,874 | B1 * | 12/2003 | Galli | H01H 36/00 |
| | | | | 335/205 |
| 6,972,558 | B1 * | 12/2005 | Robinson | G01D 5/145 |
| | | | | 324/207.2 |
| 7,089,042 | B2 * | 8/2006 | Bodley | H04M 1/05 |
| | | | | 381/104 |
| 8,134,431 | B2 | 3/2012 | Mozer et al. | |
| 8,929,573 | B2 | 1/2015 | Ruwe et al. | |
| 2005/0153748 | A1 * | 7/2005 | Bodley | H04M 1/05 |
| | | | | 455/569.1 |
| 2005/0162227 | A1 * | 7/2005 | Galli | H01H 36/00 |
| | | | | 330/205 |
| 2010/0050731 | A1 * | 3/2010 | Granig | G01D 5/145 |
| | | | | 73/1.11 |
| 2010/0052661 | A1 * | 3/2010 | Francis | G01D 5/145 |
| | | | | 324/207.25 |
| 2012/0038351 | A1 * | 2/2012 | Saruki | G01R 33/091 |
| | | | | 324/207.25 |
| 2013/0200883 | A1 | 8/2013 | Mehnert et al. | |
| 2013/0208940 | A1 * | 8/2013 | Hansen | H04R 1/1025 |
| | | | | 381/384 |
| 2013/0218517 | A1 * | 8/2013 | Ausserlechner | G01B 7/30 |
| | | | | 702/151 |
| 2014/0176125 | A1 * | 6/2014 | Friedrich | G01R 33/0023 |
| | | | | 324/207.2 |

* cited by examiner

MAGNETIC PIVOT SENSOR FOR HEADSET MICROPHONE

BACKGROUND

This description relates generally to headsets, and more specifically, to a magnetic pivot sensor for movably coupling a boom microphone to a headband, earcup, or earbud of a headset.

BRIEF SUMMARY

In accordance with one aspect, a microphone pivot device of a headphone comprises at least one magnet in communication with a movable microphone, the at least one magnet having a plurality of segments, each segment having a magnet characteristic; a sensor that detects a magnet characteristic of a magnet segment when the segment is moved in response to a movement of the microphone so that the segment is in proximity of the sensor; and a controller that receives a signal from the sensor in response to the detected magnet characteristic, and that controls an operation of the microphone in response to the received signal.

Aspects may include one or more of the following features.

The controller may activate the microphone when the detected magnet characteristics of the segment exceeds a predetermined threshold.

The controller may inactivate the microphone when the detected magnet characteristic of the segment is below a predetermined threshold.

The magnet characteristic may comprise at least one of a magnetic force, magnetic field strength, or flux density.

The magnet segments may have different shapes, polarities, sizes, magnetic forces, magnetic field strengths, or flux densities, or a combination thereof.

The sensor may comprise at least one of: a magnetic flux sensor or a Hall Effect sensor.

The at least one magnet may comprise two multi-pole magnets substantially aligned with each other, wherein the poles of one magnet oppose the poles of the other magnet, and wherein the sensor is positioned between the two multi-pole magnets for sensing magnetic field strength between the two magnets.

The sensor may sense an alignment of the poles of the magnets, and generates a value in response to the sensed alignment, and the value is used by the controller to control the operation of the microphone.

The microphone may be a boom microphone that extends from the headphone.

The controller may activate the microphone when the microphone is moved in front of a headphone wearer's mouth and in response to the sensor sensing the microphone characteristic, the sensor may output a microphone activation signal to the controller, and the controller may inactivate the microphone when the microphone is moved away from the headphone wearer's mouth and in response to the sensor sensing the microphone characteristic, the sensor may output a microphone inactivation signal to the controller.

The at least one magnet may rotate relative to the sensor in response to the movement of the microphone.

Each magnet segment may correspond to a different magnetic detent position of the microphone.

The microphone pivot device may be rotatably positioned between a boom microphone and a headband or earbud of the headphone.

In another aspect, provided is a headset, comprising: a headset body; a boom microphone; and a pivot device between the headset body and the boom microphone that rotates the boom microphone relative to the headset body, the pivot device comprising: at least one magnet in communication with the boom microphone, the at least one magnet having a plurality of segments, each segment having a magnet characteristic.

Aspects may include one or more of the following features.

The headset may further comprise a sensor that detects a magnet characteristic of a magnet segment when the segment is moved in response to a movement of the boom microphone so that the segment is in proximity of the sensor.

The headset may further comprise a controller that receives a signal from the sensor in response to the detected magnet characteristic, and that controls an operation of the microphone in response to the received signal.

The headset body may comprise an earbud.

The headset body may comprise an earphone coupled to a headband.

In another aspect, a method for positioning a microphone of a headset, comprises arranging a pivot device to provide for a rotation of a boom microphone relative to a headset body; detecting by a sensor of the pivot device a proximity of a magnet of the pivot device relative to the sensor corresponding to a location of the boom microphone; and controlling by a controller an operation of the boom microphone in response to the sensor detecting the proximity of the magnet relative to the sensor.

BRIEF DESCRIPTION

The above and further advantages of examples of the present inventive concepts may be better understood by referring to the following description in conjunction with the accompanying drawings, in which like numerals indicate like structural elements and features in various figures. The drawings are not necessarily to scale, emphasis instead being placed upon illustrating the principles of features and implementations.

DETAILED DESCRIPTION

Conventional aviation headsets typically include a microphone boom extending from one of the headphones (e.g., an earcup or earbud) by mechanical elements that permit the microphone boom, or "friction boom," to be adjustable, for example, moved up and down or to either side of the wearer's mouth. However, precise adjustments are limited. Also, the mechanical components allowing boom adjustments to occur involve friction or forces applied to the components, which reduce their long-term durability.

In brief overview, a magnetic pivot sensing device is provided that permits the precise positioning of an adjustable boom microphone, while also automatically activating or inactivating the boom microphone depending on the rotational position of the microphone. These features are beneficial in certain applications such as aviation headphones where it is desirable to inactivate the microphone when the microphone is facing away from the wearer's mouth. Absent such automatic inactivation of the microphone, the microphone may sense and process undesirable ambient sounds in the vicinity of the microphone. In addition, these features enable the microphone to be automatically activated when rotated to a position in front of a user's mouth, thereby avoiding an additional user interaction to activate the microphone.

The magnetic pivot sensing device in some examples may include a segmented magnet that may function as a magnetic detent assembly or rotary switch, where each magnet segment corresponds to a detent position of the boom microphone. For example, the magnet segments may be constructed and arranged to have different shapes, polarities, sizes, magnetic forces, magnetic field strengths, or flux densities, or a combination thereof, and/or other characteristics that distinguish the segments from each other. The magnet rotates in concert with the pivoting motion of the boom microphone. As the microphone and magnet are rotated, a stationary Hall Effect sensor or the like can detect the presence of the segments as they rotate past the sensor. More specifically, the Hall Effect sensor can determine characteristics of the magnet and/or the alignment of the segments relative to different magnets or to the sensor(s) when the segments are within a range of detection by the sensor(s). Each sensor produces detection results, which are output to and processed by a controller, which in turn activates or inactivates the boom microphone according to the location of the sensed magnet segments relative to the sensor. Since non-contact magnetic sensing is utilized, a headset including a magnetic pivot sensing device does not exhibit the mechanical wear and tear associated with conventional mechanical switches, detents, or associated microphone boom positioning devices.

Figure 1A:
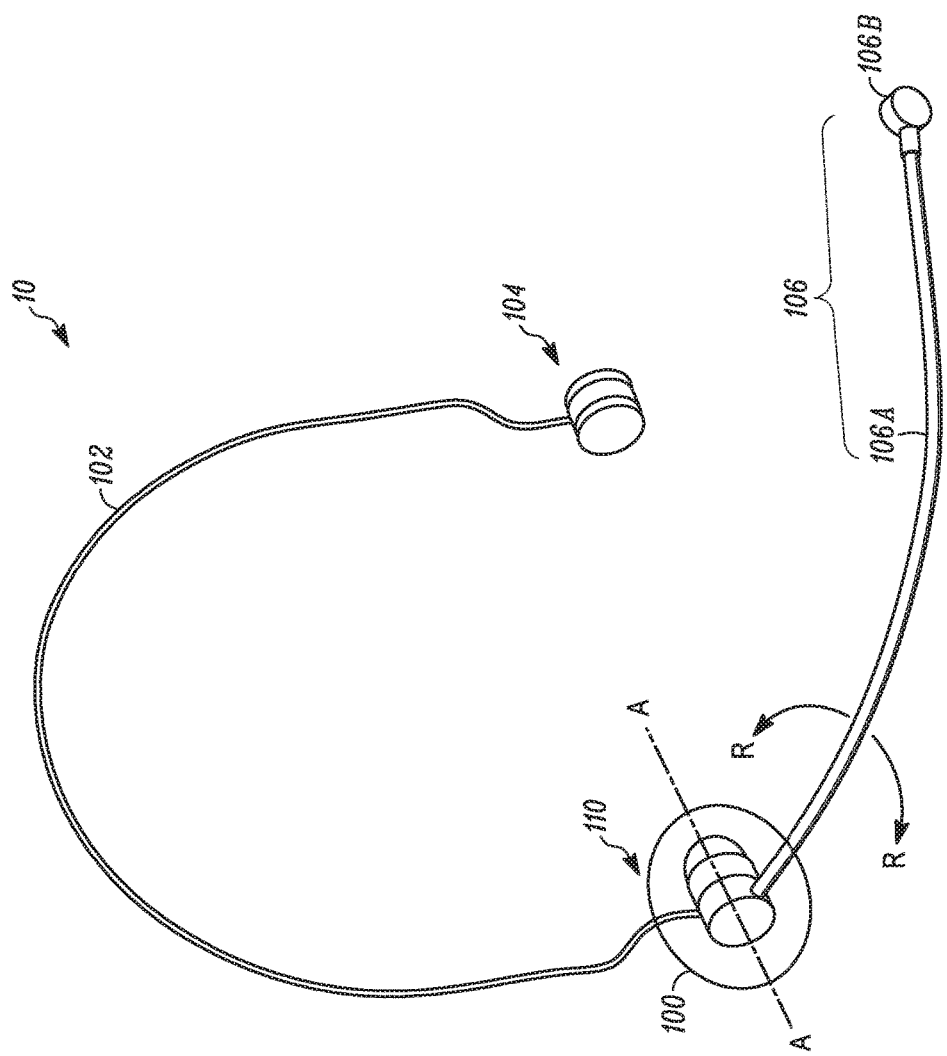
FIG. 1A is a perspective view of a headset, in accordance with some examples.
Figure 1B:
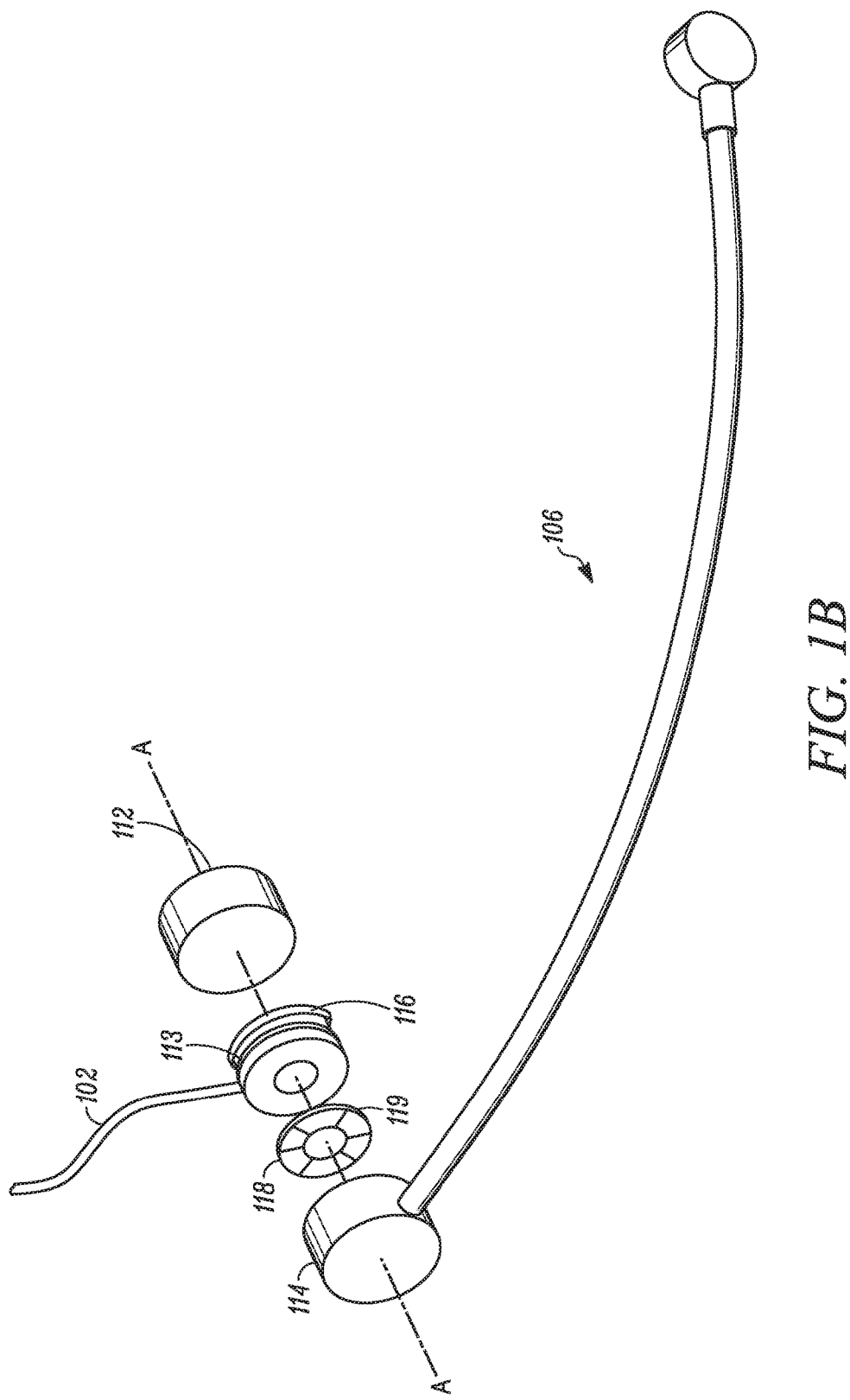
FIG. 1B is an exploded view of a microphone pivot device of the headset of FIG. 1A.

FIG. 1A is a perspective view of a headset 10, in accordance with some examples. FIG. 1B is an exploded view of a microphone pivot device 100 of the headset 10 of FIG. 1A.

In some examples, the headset 10 includes a headband assembly 102 having a first end 104 and a second end 110. The headband assembly 102 is, for example, U-shaped so that it fits around a wearer's head, and may be formed of a flexible high tensile strength material, for positioning over the wearer's head. In some examples, the headband may have a soft cover, padding, or cushion to improve comfort of the headband when resting on a wearer's head. In some examples, an earphone having an electro-acoustic transducer may be at the first end 104 and/or second end 110 of the headband assembly 102. While not shown in FIGS. 1A-1B, the headset 10 may include a combination of two earcups or earbuds on either side of the headband, audio speakers, active noise reduction (ANR) circuitry, and one or more microphones. The microphones may include an external microphone (or feedforward microphone if used for ANR), an internal microphone (or feedback microphone if used for ANR), and a communications microphone, which may be the boom microphone. In other examples, as shown in FIGS. 1A-1B, the headset 10 may be a standalone boom microphone headset, and include cushions or pads at the first 104 and second 110 ends, for example, earpads, temple pads, foam cushions, plastic contoured elements, or the like that provide comfort to the wearer when the ends 104, 110 are positioned over the head and at or about the temple or ears of the wearer.

The headset 10 may include a boom microphone 106 that extends from the first end 104 or the second end 110 of the headband assembly 102. In FIGS. 1A and 1B, the boom microphone 106 is shown as extending from the second end 110 of the headband assembly 102. In examples of a standalone boom microphone headset, as in FIGS. 1A-1B, a microphone pivot device 100 may be coupled between the boom microphone 106 and the second end 110 of the headband assembly 102 to permit the boom microphone 106 to rotate about an axis A that extends tangentially or orthogonally with respect to a direction of extension of the second end 110 of the headband assembly 102. In particular, the boom microphone 106 includes a gooseneck boom 106A or the like having a first end coupled to the microphone pivot device 100 that permits the boom microphone 106 to rotate about the axis A, and allows adjustment of the position of microphone 106B at a second end of the gooseneck boom 106A or the like opposite the first end. The microphone 106B may be an electret condenser microphone, dynamic microphone, or other type of transducer known to those of ordinary skill in the art well-known for converting sound into electrical signals. This configuration permits the boom microphone 106 to experience a range of motions about axis A (shown by arrows (R)), which may extend in one direction from a region proximal the wearer's mouth to the head, and/or in another direction from the mouth to the chin or neck. In some examples, the boom microphone 106 can rotate 360 degrees about the axis A. In other examples, the boom microphone 106 can rotate less than 360 degrees about the axis A, for example, limited to an up and down motion of the microphone 106B, or less than 180 degree motion of the first end of the gooseneck boom 106A coupled to the microphone pivot device 100. The boom microphone 106 may include mechanical and/or electrical elements that prohibit a rotation beyond a predetermined threshold, e.g., 180 degrees.

The microphone pivot device 100 may include an external cushion 112, a rotatable shell portion 114, a headband mounting ring 116, and at least one magnet 118. The microphone pivot device 100 also includes a sensor 122 which may be positioned in the headband mounting ring 116, and which senses locations of the magnet 118 during rotation of the magnet 118 corresponding to a rotational movement of the boom microphone 106 about axis A at the headband assembly 102, and provides the magnet location information to a controller (also not shown in FIGS. 1A and 1B but described in detail with respect to FIGS. 3, 5A, and 5B) for activating or inactivating the boom microphone 106.

The first end of the boom 106A may be fixedly coupled to the rotatable shell portion 114. In some examples, the magnet 118 is coupled to the shell portion 114, and rotates with the shell portion 114 when a force is applied to the boom microphone 106, for example, a force applied in a direction R shown in FIG. 1A. In some examples, the shell portion 114 may include a linear element such as a rod, shaft, or the like that is inserted through a hole in a ring magnet 118.

Figure 6:
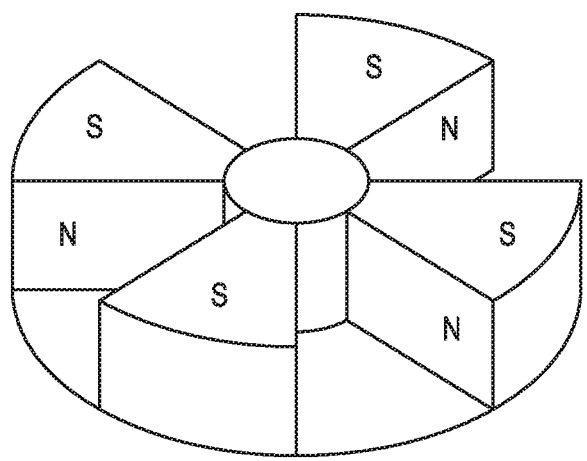
FIG. 6 is a perspective view of an axially magnetized ring of a microphone pivot device, in accordance with some examples.
Figure 7:
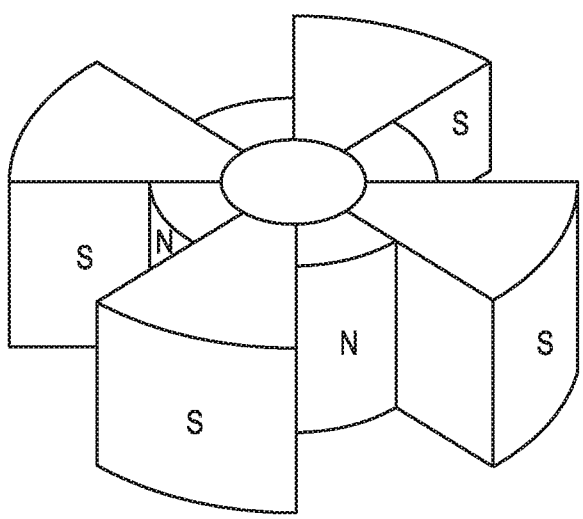
FIG. 7 is a perspective view of a radially magnetized ring of a microphone pivot device, in accordance with some examples.

The magnet 118 may include a plurality of segments 119. For example, each segment 119 may correspond to a different magnetic detent position of the boom microphone 106 due to the different characteristics of the segments 119. The magnet segments 119 may be formed of the same, similar, or different materials, shapes, patterns, polarities, sizes, magnetic forces, magnetic field strengths, or flux densities or capacities, or other characteristic or a combination thereof. For example, each segment 119 may have a different strength, size, and/or width to correspond with different detent positions. In another example, segment patterns may be regular or irregular. In another example, the segments 119 may be different with respect to any number of poles, sizes, variations in a spacing of poles, even or uneven number of poles, and/or other segment differences. In some examples, as shown in FIG. 6, a magnet 118 may be segmented with a plurality of pole pairs, where the poles are oriented axially. In other examples, as shown in FIG. 7, the magnetic poles are oriented radially.

The external cushion 112 may be coupled to the mounting ring 116, for example, positioned over a lip 113 of the mounting ring 116. The mounting ring 116 permits the shell portion 114 to rotate relative to the housing 112. The external cushion 112 is positioned at an end of the microphone pivot device 100 for abutting a temple, ear, or other part of the face when worn by a user.

In addition to providing a pivot point for the boom microphone 106, the microphone pivot device is constructed and arranged to control an output of the microphone 106B, described in detail below.

As shown in FIGS. 1A and 1B, a headset 10 in some examples includes a headband assembly 102 and a stand-alone boom microphone 106 with no specific headset features such as earcups, earbuds, speakers, ANR devices, and so on. In other examples, although not shown, the headband assembly 102 and standalone boom microphone 106 may be combined with some or all of these headset features. For example, earcups, earbuds, speakers, ANR devices, and so on may be attached to or part of the headset 10 including the headband assembly 102 and microphone 106, or interface separately with a wearer's ears.

Figure 2:
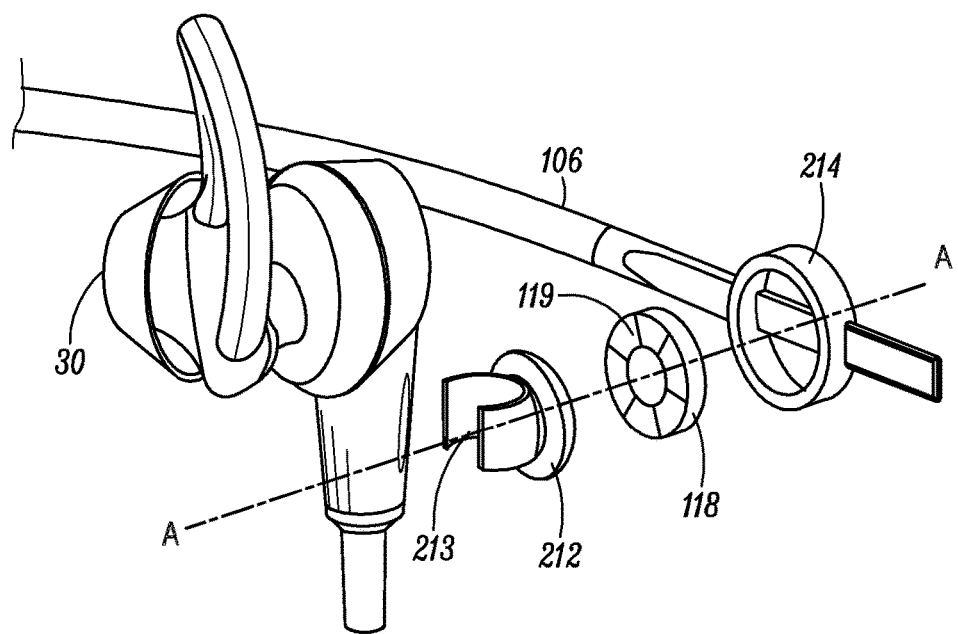
FIG. 2 is an exploded view of a microphone pivot device, in accordance with other examples.

FIG. 2 is an exploded view of a microphone pivot device 200, in accordance with some examples. In the example of FIG. 2, the microphone pivot device 200 is incorporated into a headset having one or more earcups or earbuds with an associated electro-acoustic transducer for outputting audio to a wearer's ear(s). As such, the microphone pivot device 200 is constructed and arranged for an earbud 30 or related headset component (e.g., earcup).

The microphone pivot device 200 includes an adapter 212, a rotatable shell portion 214, and at least one magnet 118. The magnet 118 in FIG. 2 may be similar to or the same as magnet 118 described in FIGS. 1A and 1B, for example, including a plurality of segments 119. In some examples, a difference between the microphone pivot device 200 shown and described with respect to FIG. 2 and the microphone pivot device illustrated in FIGS. 1A and 1B is that the microphone pivot device 200 does not include a headband mounting ring 116, since the pivot device 200 shown in FIG. 2 includes a clip 213 or other attachment mechanism extending from the adapter 212 for coupling to the earbud 30. In other examples, the microphone pivot device 200 may be coupled to the headband assembly via an associated mounting ring, for example, mounting ring 16 shown in FIGS. 1A-1B, and the microphone pivot device 200 may be decoupled from the earbud 30. The magnet 118 is constructed and arranged for coupling to the rotatable shell portion 214, so that the magnet 118 may rotate (shown by arrow R) about an axis A with the shell portion 214 in relation to the stationary adapter 212.

Figure 3:
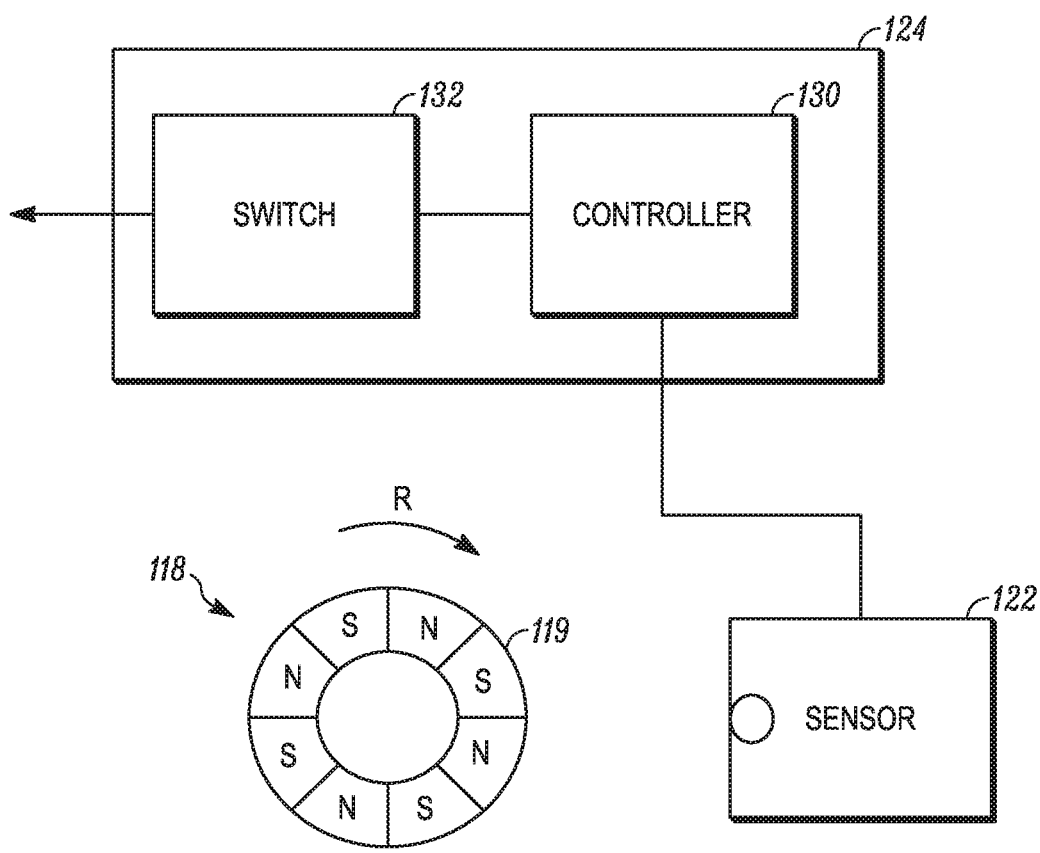
FIG. 3 is a schematic diagram of a microphone line circuit in communication with elements of a microphone pivot device, in accordance with some examples.

FIG. 3 is a schematic diagram of a microphone line circuit 124 in communication with a microphone pivot device, for example, the microphone pivot device 100 shown and described with respect to FIGS. 1A and 1B or the microphone pivot device 200 shown and described with respect to FIG. 2, which includes a magnet 119, and may further include a sensor 122 and a controller 130. The controller 130 may be co-located with, and be part of, the line circuit 124 as shown in FIG. 3. In other examples, the controller 130 is physically separate from the line circuit 124 but in electronic communication with the line circuit 124, for example, via conductive wiring.

As shown in FIG. 3, during operation where the microphone boom 106 is moved by a wearer, i.e., rotates about the axis A shown in FIG. 1A or FIG. 2, one of the magnet 118 and sensor 122 moves relative to the other of the magnet 118 and sensor 122. Thus, the sensor 122 is positioned in the presence of a magnetic field, and measures the strength of the magnetic field of the magnet 118 (or a segment 119 thereof), and in doing so can detect a position and/or angle of the magnet, change in magnetic field strength, and/or other feature of the magnetic field related to the location of a particular segment 119 to the sensor 122. Sensor 122 can be any sensor that detects a magnetic field, such as a resistive sensor, photoelectric sensor, capacitive sensor, inductive sensor, or magnetic sensor. In some examples, the sensor 122 includes a Hall Effect sensor, Reed switch, or the like, which generates a signal that may be output to a controller 130. For example, the sensor 122 can be programmed to associate a specific output voltage or other signal with a particular segment 119 of the magnet 118, and provide an analog or digital output signal that corresponds to this output voltage or other signal.

Figure 5A:
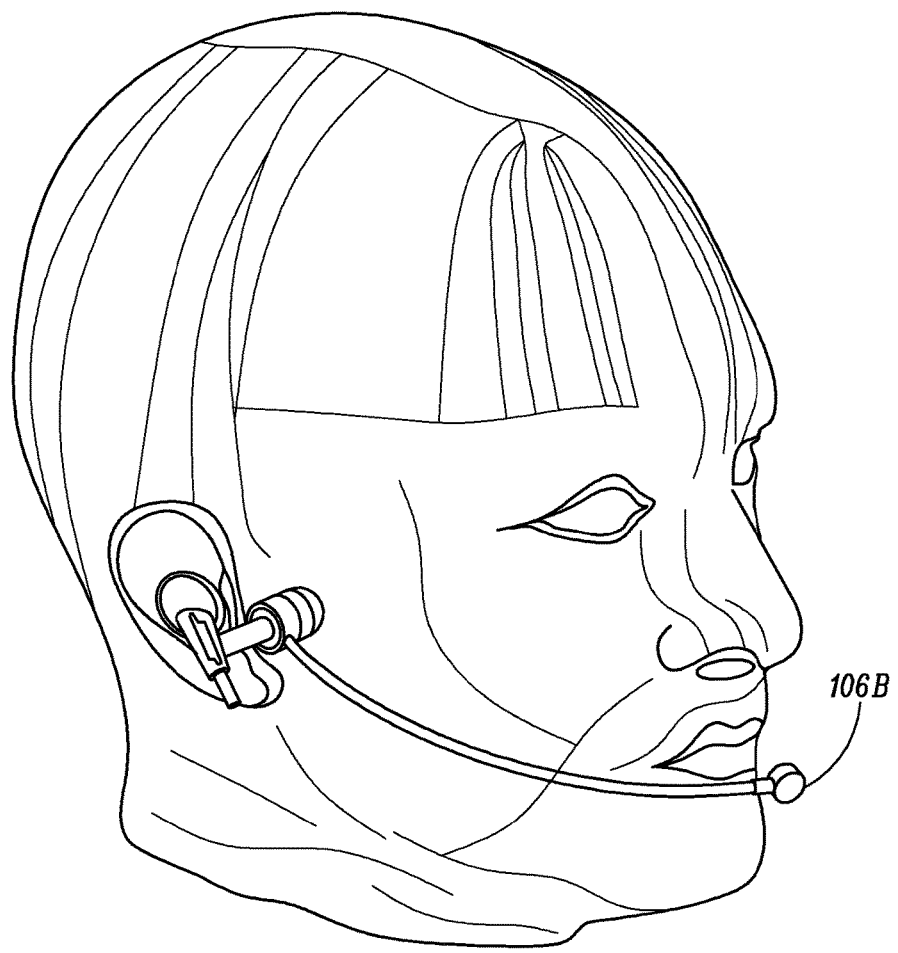
FIG. 5A is an illustrative view of an operation of a microphone pivot device when a boom microphone is in a first position near a wearer's mouth, in accordance with some examples.
Figure 5A:
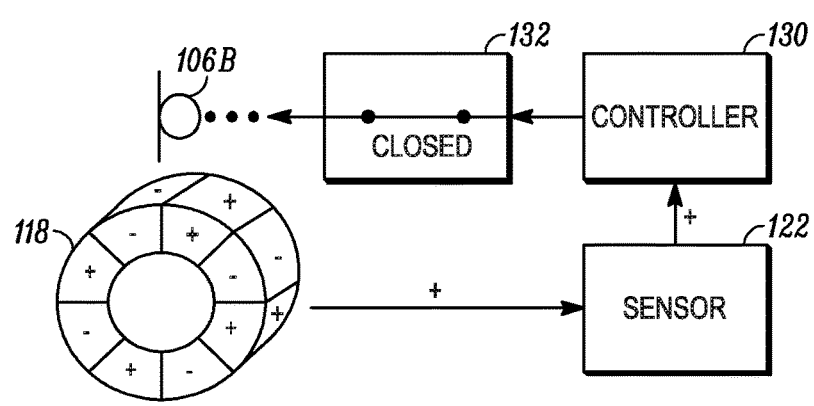
Figure 5B:
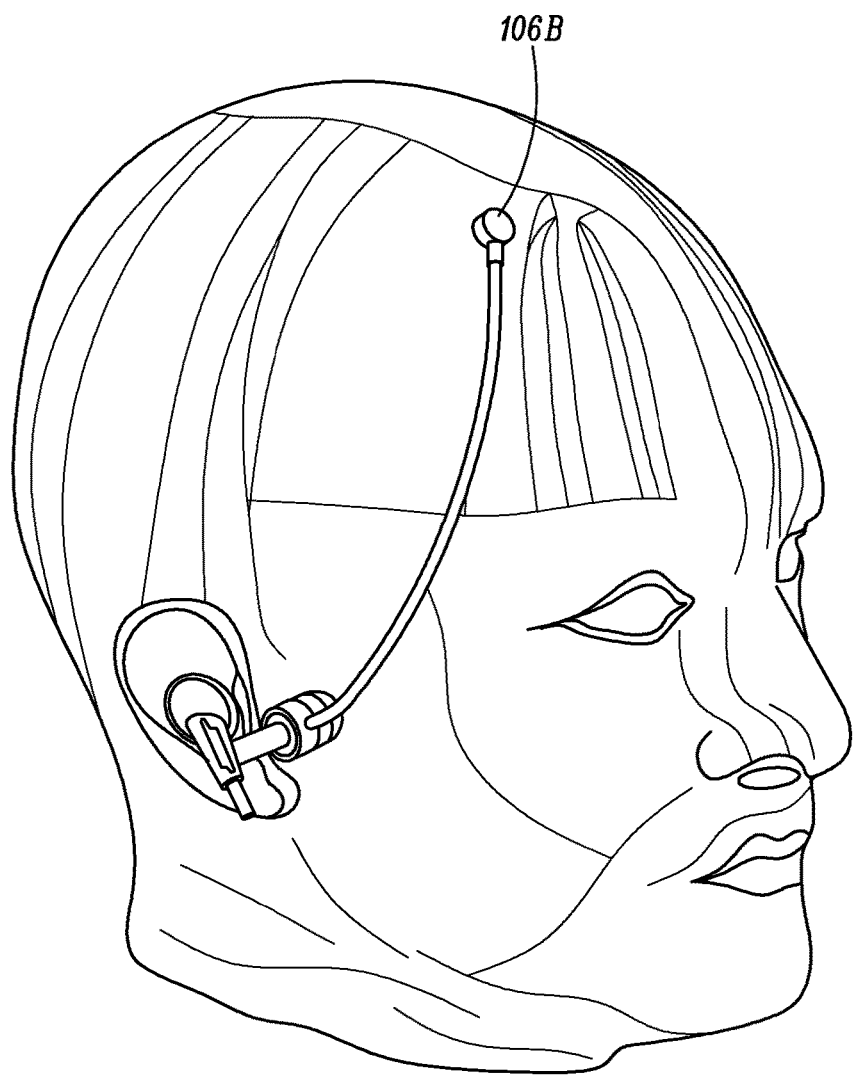
FIG. 5B is an illustrative view of an operation of the microphone pivot device of FIG. 5A when the boom microphone is in a second position away from the wearer's mouth, in accordance with some examples.
Figure 5B:
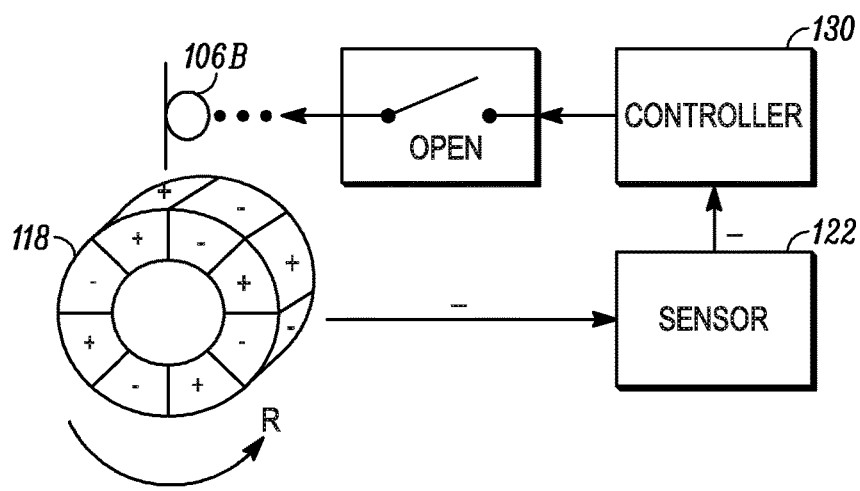

The controller 130 receives a signal from the sensor 122 in response to a detected magnet characteristic, e.g., magnetic force, magnetic field strength, flux density, and so on, and controls an operation of the boom microphone 106 in response to the received signal. For example, the controller 130 can activate or inactivate the boom microphone 106 depending on the position of the boom microphone 106. When the boom microphone 106 is moved, one of the magnet 118 and the sensor 122 moves relative to the other of the magnet 118 and the sensor 122. For example, the magnet 118 may be positioned in the rotatable shell portion 114 and the sensor 122 may be positioned in the stationary headband mounting ring 116. As shown in FIGS. 5A and 5B, the act of rotating the magnet 118 may result in the activation of a switch 132 between the sensor 122 and the boom microphone 106, which can turn the microphone 106B at the end of the boom 106A on or off. To achieve this, the sensor 122 detects a characteristic associated with the magnet segment 119 adjacent the sensor 112 which in turn establishes a location of the boom microphone 106. The sensor 122 outputs a voltage or other signal to the controller 130, which can associate the voltage or other signal with a position or location of the boom microphone. For example, the controller may store, in an associated memory, a lookup table of voltages and corresponding positions of the boom microphone. Certain positions of the boom microphone can be identified as being within the vicinity of a wearer's mouth, and thus a position where the boom microphone should be activated. By contrast, certain positions of the boom microphone can be identified as being away from a wearer's mouth, and thus a position where the boom microphone should be inactivated. Thus, the boom microphone 106 may be activated, inactivated, or otherwise controlled depending on the location of the boom microphone 106.

For example, as shown in FIG. 5A, when the boom microphone 106 is placed in front of the wearer's mouth, the controller 130 receives an activation signal ("+") from the sensor 122 in response to the sensor 122 sensing a location of the magnet 118 during rotation of the magnet 118 corresponding to a specific rotational movement of the boom microphone 106 near the wearer's mouth. As shown in FIG. 5B, when the boom microphone 106 is placed away from the wearer's mouth, the controller 130 receives an inactivation signal ("−") from the sensor 122 in response to the sensor 122 sensing a location of the magnet 118 during rotation of the magnet 118 corresponding to a specific rotational movement of the boom microphone 106 away from the wearer's mouth.

In another example, when the boom microphone 106 is positioned to be close to the wearer's mouth, certain magnet segments 119 are close to the sensor 122, and may activate the sensor 122 due to the magnetic field exceeding a threshold, which passes a microphone activation signal to the controller 130, which then closes a switch 132 to activate the boom microphone 106.

As shown in FIG. 3, the controller 130 and switch 132 are part of a microphone line circuit 124, but are not limited thereto. For example, the controller 130 and switch 132 may instead be part of the Hall effect sensor 122 to collectively form a digital switch, or may be separate from other circuitry in the headset. When the boom microphone 106 is positioned away from the wearer's mouth, the segments 119 that are close to the sensor 112 cause the magnetic field to fall below a threshold, and the sensor 122 outputs a microphone inactivation signal to the controller 130, which then opens the switch 132 to inactivate the boom microphone 106.

In other examples, the sensor 122 detects each segment 119, for example, an increase in magnetic field strength or magnetic flux of the segment 119, as it passes by the sensor 122 during rotation. The sensor 122 or processing device in communication with the sensor 122 may count the number of detected segments 119, for example, the number of increases of magnetic field strength or magnetic flux of the segments 119 which can be used by the controller 130 to determine a position of the boom microphone 106.

The switch 132 may serve as one particular example of circuitry that can be used to activate or inactivate the boom microphone 106. In other examples, a switch is not provided, and the boom microphone 106 is activated or inactivated by controlling a voltage and/or current used to drive the boom microphone 106, or by controlling the microphone sensitivity, or the like via the line circuit 124. Also, the sensor 122 may provide values that permit more than two states (i.e., active/inactive) to be performed. For example, the microphone line circuit 124 may include a control device (not shown) that reduces or otherwise interrupts a DC bias voltage to the microphone 106B in a gradual manner, for example, so that the microphone gradually approaches an active or inactive state instead of in a binary manner.

Figure 4:
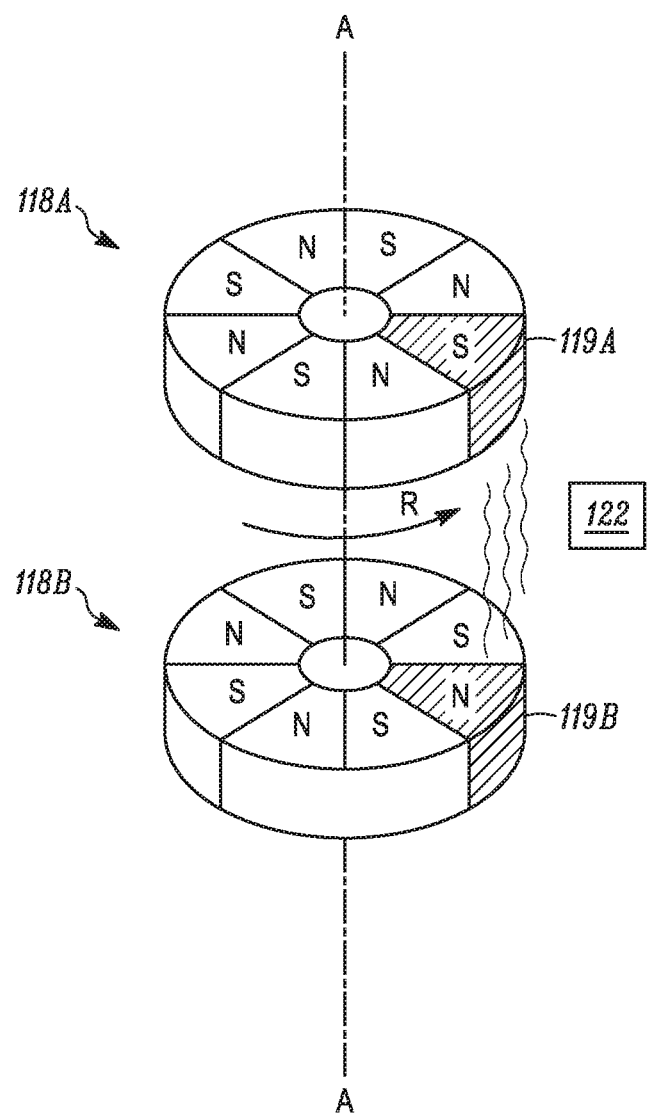
FIG. 4 is a schematic diagram of a microphone pivot device including two magnets, a sensor, and a controller, in accordance with some examples.

FIG. 4 is a diagram illustrating two multi-pole magnets 118A, 118B and a sensor 122 of a pivot device, in accordance with some examples. The multiple magnet configuration illustrated in FIG. 4 may be included in the magnetic pivot sensor configurations of FIGS. 1-3. Each magnet 118A, 118B is constructed and arranged to include a plurality of segments 119, each having a different polarity, size, shape, strength, and/or other magnet characteristic, as described above with regard to FIGS. 1-3. The magnets 118A, 118B are aligned with each other along an axis A. At least one sensor 122 is positioned adjacent to, and substantially between the magnets 118A, 118B to sense a magnetic field strength between the segments close to the sensor 112 (e.g., segments 119A, 119B of the magnets 118A, 118B in FIG. 4). In some examples, multiple sensors 122 may be employed, for example, three sensors separated by 120 degrees along a plane about the axis A. Each sensor 122 produces detection results, which are output to and processed by the controller 130. The receipt of multiple location data in this manner permits the controller 130 to activate or inactivate the boom microphone 106 with greater accuracy, and with a greater range of motions about axis A than with a single sensor. In some examples, one of the magnets 118A, 118B rotates in a direction R relative to the other of the magnets 118A, 118B.

The sensor 122 can sense the alignment of the various segments 119A, 119B relative to each other. For example, the sensor 122 can determine a value corresponding to, for example, a detected magnetic field strength or magnetic flux of the segment 119A of the first magnet 118A when it is aligned with the segment 119B of the second magnet 118B. The alignment of the segments 119A, B in this manner may be established by a position of the boom microphone 106, or more specifically, the position of the rotatable shell portion 114 of the pivot device 100 of FIG. 1 or shell portion 214 of the pivot device 200 of FIG. 2 from which the boom 106 extends. The determined value may be used to activate or inactive the boom microphone 106. As before, the output of the sensor 112 may be coupled to a controller that associates the determined value with a location or position of the boom microphone. The pivot sensor may include a memory device in communication with the controller that stores a table including a set of boom microphone positions and corresponding values, for example, binary values, produced by the sensor in response to various alignments of the magnet segments 119A, 11B relative to each other.

A number of implementations have been described. Nevertheless, it will be understood that the foregoing description is intended to illustrate and not to limit the scope of the inventive concepts which are defined by the scope of the claims. Other examples are within the scope of the following claims.

What is claimed is:

1. A microphone pivot device of a headphone comprising:
at least one magnet in communication with a movable microphone, wherein the at least one magnet is positioned along, and rotates about, an axis, the at least one magnet having a plurality of segments, each segment having a magnet characteristic, and wherein the microphone is at a distal end of a boom and the at least one magnet and the axis are at a proximal end of the boom;
a sensor that detects a magnet characteristic of a magnet segment in response to the rotation of the microphone about the axis so that the segment is in proximity of the sensor, wherein one of the at least one magnet or the sensor also rotates about the axis relative to the other of the at least one magnet and the sensor so that a first magnet segment of the magnet is proximal to the sensor so that a first magnet characteristic of the first magnet segment is detected by the sensor and a further rotation of the microphone about the axis provides a second magnet segment of the magnet to be proximal to the sensor so that a second magnet characteristic of the second magnet segment different than the first magnet characteristic is detected by the sensor; and a line circuit between the sensor and the microphone, the line circuit comprising:

a controller that receives a signal from the sensor in response to each of the detected first and second magnet characteristics, and that controls an operation of the microphone based on the rotational position of the microphone in response to the received signal; and a switch that receives a first signal from the controller in response to one of the detected first and second magnet characteristics, wherein the switch is in a closed position in response to receiving the first signal to activate the microphone at the distal end of the boom, wherein the switch receives a second signal from the controller in response to another of the detected first and second magnet characteristics, and wherein the switch is in an open position in response to receiving the second signal to inactivate the microphone.

2. The microphone pivot device of claim 1, wherein the controller activates the microphone when the detected magnet characteristics of the segment exceeds a predetermined threshold.

3. The microphone pivot device of claim 1, wherein the controller inactivates the microphone when the detected magnet characteristic of the segment is below a predetermined threshold.

4. The microphone pivot device of claim 1, wherein the magnet characteristic comprises at least one of a magnetic force, magnetic field strength, or flux density.

5. The microphone pivot device of claim 1, wherein the magnet segments have different shapes, polarities, sizes, magnetic forces, magnetic field strengths, or flux densities, or a combination thereof.

6. The microphone pivot device of claim 1, wherein the sensor comprises at least one of: a magnetic flux sensor or a Hall Effect sensor.

7. The microphone pivot device of claim 1, wherein the at least one magnet comprises two multi-pole magnets substantially aligned with each other, wherein the poles of one magnet oppose the poles of the other magnet, and wherein the sensor is positioned between the two multi-pole magnets for sensing magnetic field strength between the two magnets.

8. The microphone pivot device of claim 7, wherein the sensor senses an alignment of the poles of the magnets, and generates a value in response to the sensed alignment, and the value is used by the controller to control the operation of the microphone.

9. The microphone pivot device of claim 1, wherein the microphone is a boom microphone that extends from the headphone.

10. The microphone pivot device of claim 9, wherein the controller activates the microphone when the microphone is moved in front of a headphone wearer's mouth and in response to the sensor sensing the one of the first or second magnet characteristics, the sensor outputs a microphone activation signal to the controller, and wherein the controller inactivates the microphone when the microphone is moved away from the headphone wearer's mouth and in response to the sensor sensing the other of the first or second magnet characteristics, the sensor outputs a microphone inactivation signal to the controller.

11. The microphone pivot device of claim 1, wherein the at least one magnet rotates relative to the sensor in response to the movement of the microphone.

12. The microphone pivot device of claim 1, wherein each magnet segment corresponds to a different magnetic detent position of the microphone.

13. The microphone pivot device of claim 1, wherein the microphone pivot device is rotatably positioned between a boom microphone and a headband or earbud of the headphone.

14. A headset, comprising:

a headset body;

a boom microphone that rotates about an axis; and a pivot device between the headset body and the boom microphone that rotates the boom microphone about the axis and relative to the headset body, the pivot device comprising:

at least one magnet in communication with the boom microphone, the at least one magnet having a plurality of segments, each segment having a magnet characteristic, wherein the at least one magnet is positioned along, and rotates about, the axis with the boom microphone so that so that a first magnet characteristic of a first magnet segment is detected by a sensor and wherein the boom microphone further rotates about the axis positions so that a second magnet characteristic of a second magnet segment different than the first magnet characteristic is detected by the sensor and wherein the boom microphone is at a distal end of a boom and the at least one magnet and the axis are at a proximal end of the boom, the headset further comprising:

a line circuit between the sensor and the microphone, the line circuit comprising:

a controller that receives a signal from the sensor in response to each of the detected first and second magnet characteristics, and that controls an operation of the microphone based on the rotational position of the boom microphone in response to the received signal; and a switch that receives a first signal from the controller in response to one of the detected first and second magnet characteristics, wherein the switch is in a closed position in response to receiving the first signal to activate the boom microphone at the distal end of the boom, wherein the switch receives a second signal from the controller in response to another of the detected first and second magnet characteristics, and wherein the switch is in an open position in response to receiving the second signal to inactivate the boom microphone.

15. The headset of claim 14, further comprising:

the sensor that detects the magnet characteristic of a magnet segment of the segments when the magnet segment is moved in response to a movement of the boom microphone so that the magnet segment is in proximity of the sensor.

16. The headset of claim 14, wherein the headset body comprises an earbud.

17. The headset of claim 14, wherein the headset body comprises an earphone coupled to a headband.

18. A method for positioning a microphone of a headset, comprising:

arranging a pivot device to provide for a rotation of a boom microphone about an axis and relative to a headset body;

detecting by a sensor of the pivot device a proximity of a magnet of the pivot device relative to the sensor corresponding to a location of the boom microphone, wherein one of the magnet and the sensor also is positioned along, and rotates about, the axis relative to the other of the magnet and the sensor so that a first magnet segment of the magnet is proximal to the sensor so that a first magnet characteristic of the first magnet segment is detected by the sensor and a further rotation of the microphone about the axis provides a second magnet segment of the magnet to be proximal to the sensor so that a second magnet characteristic of the second magnet segment different than the first magnet characteristic is detected by the sensor; and controlling by a controller an operation of the boom microphone in response to the sensor detecting the proximity of the magnet relative to the sensor, and wherein the microphone is at a distal end of a boom and the at least one magnet and the axis are at a proximal end of the boom, including:

receiving by a switch between the sensor and the boom microphone a first signal from the controller in response to one of the detected first and second magnet characteristics, wherein the switch is in a closed position in response to receiving the first signal to activate the boom microphone at the distal end of the boom, wherein the switch receives a second signal from the controller in response to another of the detected first and second magnet characteristics, and wherein the switch is in an open position in response to receiving the second signal to inactivate the boom microphone.

19. The microphone pivot device of claim 1, further comprising a stationary mounting ring that is positioned along the axis, wherein a headband assembly extends from the mounting ring, wherein the sensor is positioned in the mounting ring for sensing locations of the at least one magnet during rotation of the at least one magnet corresponding to a rotational movement of the microphone about the axis.

* * * * *